United States Patent
Kang

(10) Patent No.: US 8,860,077 B2
(45) Date of Patent: Oct. 14, 2014

(54) LIGHT EMITTING DEVICE AND LIGHT EMITTING DEVICE PACKAGE INCLUDING THE SAME

(75) Inventor: Dae Sung Kang, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 541 days.

(21) Appl. No.: 12/705,451

(22) Filed: Feb. 12, 2010

(65) Prior Publication Data

US 2011/0198664 A1   Aug. 18, 2011

(51) Int. Cl.
| | |
|---|---|
| *H01L 33/00* | (2010.01) |
| *H01L 33/14* | (2010.01) |
| *H01L 33/20* | (2010.01) |
| *H01L 33/38* | (2010.01) |
| *H01L 33/48* | (2010.01) |

(52) U.S. Cl.
CPC ....... *H01L 33/14* (2013.01); *H01L 2224/48247* (2013.01); *H01L 33/20* (2013.01); *H01L 33/387* (2013.01); *H01L 2224/48091* (2013.01); *H01L 33/486* (2013.01); *H01L 2924/13091* (2013.01)
USPC ......................................................... 257/101

(58) Field of Classification Search
USPC .................. 257/100, 101, E33.059, E33.043
See application file for complete search history.

(56) References Cited

U.S. PATENT DOCUMENTS

| | | | |
|---|---|---|---|
| 6,677,619 B1 | 1/2004 | Senoh et al. | |
| 7,026,653 B2 * | 4/2006 | Sun | 257/79 |
| 7,335,920 B2 * | 2/2008 | Denbaars et al. | 257/79 |
| 2002/0000563 A1 * | 1/2002 | Udagawa | 257/94 |
| 2006/0192207 A1 | 8/2006 | Wook Shim et al. | |
| 2007/0194336 A1 * | 8/2007 | Shin et al. | 257/98 |
| 2009/0020776 A1 * | 1/2009 | Lin et al. | 257/98 |
| 2009/0085057 A1 * | 4/2009 | Park et al. | 257/103 |
| 2009/0283795 A1 * | 11/2009 | Miki et al. | 257/103 |

FOREIGN PATENT DOCUMENTS

| | | |
|---|---|---|
| JP | 06-045698 A | 2/1994 |
| JP | 2003-101154 A | 4/2003 |
| JP | 2006-245532 A | 9/2006 |
| KR | 10-2009-0090986 | 8/2009 |

* cited by examiner

*Primary Examiner* — Andy Huynh
*Assistant Examiner* — Sitaramarao S Yechuri
(74) *Attorney, Agent, or Firm* — Birch, Stewart, Kolasch & Birch, LLP

(57) ABSTRACT

Provided are a light emitting device and a light emitting device package comprising the same. The light emitting device comprises a first conductive type semiconductor layer, a second conductive type semiconductor layer, and an active layer. The active layer is formed between the first conductive type semiconductor layer and the second conductive type semiconductor layer. Here, at least one of the first conductive type semiconductor layer and the second conductive type semiconductor layer has current spreading structures comprising a pair of a first conductive layer and a second conductive layer and is disposed in a sequence of the second conductive layer and the first conductive layer from the active layer.

19 Claims, 10 Drawing Sheets

LIGHT EMITTING DEVICE AND LIGHT EMITTING DEVICE PACKAGE INCLUDING THE SAME

BACKGROUND

The present disclosure relates to a light emitting device and a light emitting device package having the same.

Group III-V nitride semiconductors have been variously applied to an optical device such as blue and green Light Emitting Diodes (LED), a high speed switching device such as a Metal Oxide Semiconductor Field Effect Transistor (MOSFET), a High Electron Mobility Transistor (HEMT) and a Hetero junction Field Effect Transistor (HFET), and a light source of a lighting device or a display device.

The nitride semiconductor is mainly used for the LED or a Laser Diode (LD), and studies have been continuously conducted to improve the manufacturing process or light efficiency of the nitride semiconductor.

SUMMARY

Embodiments provide a light emitting device including a first conductive type semiconductor layer that includes a first conductive layer with a high concentration and a second conductive layer with a low concentration.

Embodiments provide a light emitting device including a second conductive type semiconductor layer that includes a first conductive layer with a high concentration and a second conductive layer with a low concentration.

Embodiments provide a light emitting device, which can improve current spreading by being disposed in a sequence of high conductive layer and low conductive layer from a current injection direction in a first conductive type semiconductor layer and/or a second conductive type semiconductor layer.

Embodiments provide a light emitting device package including a light emitting device having a current spreading structure.

An embodiment provides a light emitting device comprising: a first conductive type semiconductor layer; a second conductive type semiconductor layer; and an active layer between the first conductive type semiconductor layer and the second conductive type semiconductor layer, wherein at least one of the first conductive type semiconductor layer and the second conductive type semiconductor layer comprises current spreading structures comprising at least one pair of a first conductive layer and a second conductive layer, a conductivity of the first conductive layer is higher than a conductivity of the second conductive layer, and the current spreading structure is disposed in a sequence of the second conductive layer and the first conductive layer from the active layer.

An embodiment provides a light emitting device comprising: a first conductive type semiconductor layer having a current spread structure comprising a pair of a first conductive layer and a second conductive layer under the first conductive layer, and wherein a conductivity of the first conductive layer is higher than a conductivity of the second conductive layer; a first electrode on the first conductive type semiconductor layer; an active layer under the first conductive type semiconductor layer; a second conductive type semiconductor layer under the active layer; a channel layer around the second conductive type semiconductor layer; and an electrode layer under the second conductive type semiconductor layer.

An embodiment provides a light emitting device package comprising: a body; a plurality of lead electrodes in the body; a light emitting device electrically connected to the plurality of lead electrodes; and a molding member covering the light emitting device, wherein the light emitting device comprises: a first conductive type semiconductor layer; a second conductive type semiconductor layer; and an active layer between the first conductive type semiconductor layer and the second conductive type semiconductor layer, wherein at least one of the first conductive type semiconductor layer and the second conductive type semiconductor layer comprises current spreading structures comprising at least one pair of a first conductive layer and a second conductive layer, a conductivity of the first conductive layer is higher than a conductivity of the second conductive layer, and the current spreading structure is disposed in a sequence of the second conductive layer and the first conductive layer from the active layer.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In description of embodiments, the 'on' or 'under' of each layer may be described with reference to the accompanying drawings, and the thickness of the each layer will also be described as an example and is not limited to the thickness of the accompanying drawings.

In description of embodiments, it will be understood that in a case where a layer (or film), a region, a pattern, or components is referred to as being 'on' or 'under' another substrate, layer (or film), region or patterns, the 'on' and 'under' include all the meanings of 'directly' and 'indirectly'. Moreover, any reference of the 'on' or 'under' of each layer will be described with reference to the accompanying drawings.

Figure 1:
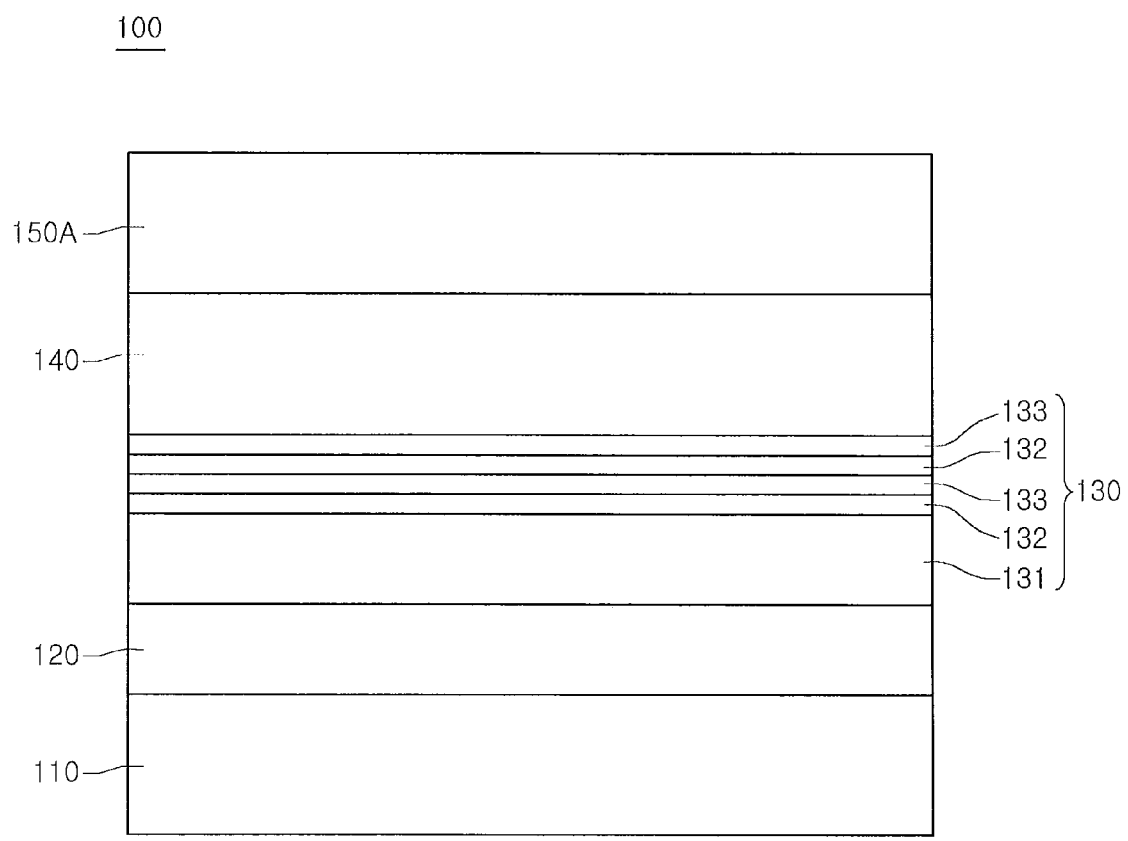
FIG. 1 is a side cross-sectional view illustrating a light emitting device according to a first embodiment.
Figure 2:
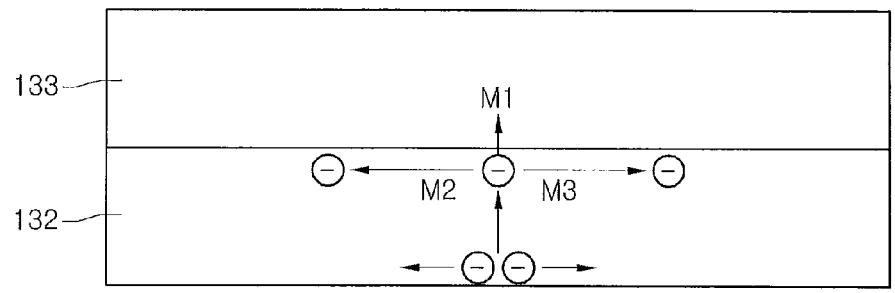
FIG. 2 is a view illustrating a current movement state in a second conductive layer and a third conductive layer of FIG. 1.

FIG. 1 is a side cross-sectional view illustrating a light emitting device according to a first embodiment. FIG. 2 is a view illustrating a current movement state in a second conductive layer and a third conductive layer of FIG. 1.

Referring to FIG. 1, a light emitting device 100 may include a substrate 110, a compound semiconductor layer 120, a first conductive type semiconductor layer 130, an active layer 140, and a second conductive type semiconductor layer 150A.

The substrate 110 may be an insulating substrate or a conductive substrate. For example, the substrate 110 may include one of sapphire ($Al_2O_3$), SiC, Si, GaAs, GaN, ZnO, Si, GaP, InP, and Ge. The substrate 110 may have an unevenness structure thereon and/or thereunder. The unevenness structure may have at least one of stripe, lens, cylinder, cone shapes.

A nitride semiconductor of group II to group V elements is grown on the substrate 110. Growth equipment may use an E-beam evaporator, a Physical Vapor Deposition (PVD) apparatus, a Chemical Vapor Deposition (CVD) apparatus, a Plasma Laser Deposition (PLD) apparatus, a dual-type thermal evaporator, a sputtering apparatus, and a Metal Organic Chemical Vapor Deposition (MOCVD) apparatus, but the embodiments are not limited to the equipment.

The compound semiconductor layer 120 may be disposed on the substrate 110. The compound semiconductor layer 120 may include a buffer layer and/or an undoped semiconductor layer. The buffer layer may mitigate a lattice mismatch between GaN material and substrate material. The buffer layer may be formed of at least one of GaN, InN, AlN, InGaN, AlGaN, InAlGaN, and AlInN. The undoped semiconductor layer may be formed of an undoped GaN-based semiconductor. Here, the compound semiconductor layer 120 may not be formed, or may be removed after growth.

The first conductive type semiconductor layer 130 may be disposed on the compound semiconductor layer 120. The first conductive type semiconductor layer 130 may be electrically connected to a first electrode or may serve as a first electrode contact layer. The first conductive type semiconductor layer 130 may be formed of a compound semiconductor of group III to group V elements, for example, at least one of GaN, InN, AlN, InGaN, AlGaN, InAlGaN, and AlInN. The first conductive type semiconductor layer 130 may be doped with first conductive type dopant. The first conductive type dopant, which is an n-type dopant, may include Si, Ge, Sn, Se, and Te.

The first conductive type semiconductor layer 130 may be formed with an n-type GaN layer having a certain thickness by supplying a silane gas with an n-type dopant such as $NH_3$, TMGa (or TEGa), and Si.

The first conductive type semiconductor layer 130 may include a current spreading structure in a certain region thereof. The current spreading structure may include semiconductor layers having a horizontal current spreading rate greater than a vertical current spreading rate. The current spreading structure may include semiconductor layers having differences in their dopant concentration and/or conductivity The first conductive type semiconductor layer 130 may include first to third conductive layers 131, 132 and 133. The first conductive layer 131 may be disposed on the compound semiconductor layer. The second conductive layer 132 may be disposed on the first conductive layer 131. The third conductive layer 133 may be disposed on the second conductive layer 132. In the current spreading structure according to this embodiment, at least one pair of conductive layers, for example, the first conductive layer 132 and the third conductive layer 133 may be disposed.

The pair of the second and third conductive layers 132 and 133 may be repeatedly disposed. Such a repeatedly stacked structure can increase the effect of the current spreading.

The first conductive layer 131 may be formed to be an n-type semiconductor layer having a normal doping concentration or a high doping concentration. Here, the first conductive layer 131 may be doped with a first conductive type dopant. The doping concentration may be equal to or greater than about $5 \sim 6 \times 10^{16}$ $cm^{-3}$. The first conductive layer 131 may have conductivity characteristics between the third conductive layer 133 and the second conductive layer 132.

The doping concentration of the second conductive layer 132 doped with a first conductive dopant may be equal to or greater than about $5 \sim 9 \times 10^{18}$ $cm^{-3}$. The doping concentration of the third conductive layer 133 doped with a first conductive dopant may be equal to or less than about $1 \sim 5 \times 10^{15}$ $cm^{-3}$. The third conductive layer 133 may also be doped with a second conductive type dopant, or may not be doped with any conductive type dopant.

The second conductive layer 132 may serve as a layer in which horizontal current movement is more activated than vertical current movement to other layers. The third conductive layer 133 on the second conductive layer 132 may serve as a layer that inhibits the vertical current movement. That is, the second conductive layer 132 may become a high conductive layer, a high concentration layer, or a low resistive layer with respect to the third conductive layer 133. The third conductive layer 133 may become a low conductive layer, a low concentration layer, or a high resistive layer with respect to the second conductive layer 132. The criterion of determining whether to be the high or low conductive layer in the first conductive type semiconductor layer 130 may depends on a difference of the dopant concentration based on the concentration of the n-type dopant having a normal concentration in the first conductive type semiconductor layer 130.

The sheet resistivity of the second conductive layer 132 may range from about 60 $\Omega$/sq to about 80 $\Omega$/sq. The sheet resistivity of the third conductive layer 133 may range from about 100 $\Omega$/sq to about 200 $\Omega$/sq.

The second conductive layer 132 may be formed of at least one of GaN, InN, AlN, InGaN, AlGaN, InAlGaN, and AlInN. The third conductive layer 133 may be formed of at least one of GaN, InN, AlN, InGaN, AlGaN, InAlGaN, and AlInN. The semiconductor materials of the second and third conductive layers 132 and 133 may be identical to or different from each other.

The pair of the second and third conductive layers 132 and 133 may be formed in about 1 to about 50 cycles. The thickness of the current spreading structure may range from about 500 Å to about 1,000 Å. That is, the total thickness of the second and third conductive layers 132 and 133 may range from about 500 Å to about 1,000 Å. Here, the third conductive layer 133 may be formed to have a thickness greater than that of the second conductive layer 132.

The first conductive type semiconductor layer may have the second and third conductive layers 132 and 133 formed at certain locations thereof. For example, the second and third conductive layers 132 and 133 may be formed at an upper portion or a center portion of the first conductive type semiconductor layer 130.

Here, the uppermost layer of the first conductive type semiconductor layer 130 may be the second conductive layer 132 or the third conductive layer 133, preferably, the second conductive layer 132. For example, the uppermost layer, the second conductive layer 132, which is a layer contacting with or closest to the active layer 140, may supply a spread current.

Referring to FIG. 2, the third conductive layer 133 may inhibit vertical movement of carriers, i.e., vertical movement of electrons (−) at the interface with the second conductive layer 132. Thus, most electrons (−) injected into the second conductive layer 132 show horizontal movement M2 and M3 distribution greater than movement M1 distribution to the third conductive layer 133, which represents the spreading of electrons (−). The distribution of electrons may be proportional to the amount and velocity of current.

The third conductive layer 133 may make an injected current of the second conductive layer 132 spread into the horizontal direction greater than into the vertical direction. That is, the vertical movement M1 velocity of carriers may be greater than the horizontal movement M2 and M3 velocity due to the third conductive layer 133.

Since the second and third conductive layers 132 and 133 are stacked in several cycles, the carriers may be spread into the whole region of the first conductive type semiconductor layer 130 in a uniform distribution. The processes of spreading carriers by the second conductive layer 132 and delivering the carriers by the third conductive layer 132 may be repeated.

The first conductive type semiconductor layer 130 may supply spread carriers to another layer thereon, e.g., the active layer 140 in a uniform distribution.

The active layer 140 may be disposed on the first conductive type semiconductor layer 130. The active layer 140 may be formed in a single quantum well or a multi quantum well structure. The cycle of the active layer may selective include a cycle of InGaN/GaN, AlGaN/InGaN, InGaN/InGaN, or AlGaN/GaN.

A first conductive type clad layer (not shown) may be disposed between the first conductive type semiconductor layer 130 and the active layer 140. The first conductive type clad layer may be formed of an n-type GaN-based semiconductor. The first conductive type clad layer may be formed of a material having an energy band gap higher than that of the well layer.

A second conductive type semiconductor layer 150A may be disposed on the active layer 140. The second conductive type semiconductor layer 150A may be implemented in a p-type semiconductor layer doped with a second conductive type dopant. The p-type semiconductor layer may be formed of one of compound semiconductors such as GaN, InN, AlN, InGaN, AlGaN, InAlGaN, and AlInN. The second conductive type dopant, which is a p-type dopant, may include at least one of Mg, Zn, Ca, Sr, and Ba.

The second conductive type semiconductor layer 150A may supply a gas including a p-type dopant such as $NH_3$, TMGa (or TEGa), and Cp2Mg to form a p-type GaN layer having a certain thickness.

A third conductive type semiconductor layer may be formed on the second conductive type semiconductor layer 150A. The third conductive type semiconductor layer may be formed of a semiconductor layer having the opposite polarity to the polarity of the second conductive type semiconductor layer 150A. For example, the second conductive type semiconductor layer 150A is a p-type semiconductor layer, the third conductive type semiconductor layer may be formed of an n-type semiconductor layer.

The first conductive type semiconductor layer 130 may be formed of a p-type semiconductor layer, and the second conductive type semiconductor layer 150A may be formed of an n-type semiconductor layer. The light emitting structure may include one of an N-P junction structure, a P-N junction structure, an N-P-N junction structure, and a P-N-P junction structure. Hereinafter, for explanation of embodiments, a second conductive type semiconductor layer will be assumed to be the uppermost layer of a semiconductor layer.

The second conductive type semiconductor layer 150A may have a second electrode and/or an electrode layer (not shown) formed thereon. The electrode layer may be formed of an oxide or nitride-based light-transmittance layer including, for example, at least one of materials selected from indium tin oxide (ITO), indium tin oxide nitride (ITON), indium zinc oxide (IZO), indium zinc oxide nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, and NiO. The electrode layer may serve as a current spreading layer that can spread a current. The electrode layer may be a reflection electrode layer, which may be formed of at least one of materials selected from Ag, Ni, Al, Rh, Pd, Ir, Ru, Mg, Zn, Pt, Au, Hf, and a combination thereof. Besides the electrode layer, other layers, e.g., an insulating layer may be further disposed on the semiconductor layer, but is not limited thereto. The second electrode may include a metal layer having a single or multi-layer structure. For example, the metal layer may be formed of at least one of Ag, Ag alloy, Ni, Al, Al alloy, Rh, Pd, Ir, Ru, Mg, Zn, Pt, Au, Hf, and a combination thereof.

A current may be supplied to the first conductive type semiconductor layer 130 and the second conductive type semiconductor layer 150A. In this case, the current supplied to the first conductive type semiconductor layer 130 may be spread to the whole region by the second conductive layer 132 and the third conductive layer 133, and may be supplied to the active layer 140 in a uniform distribution. Electrons and holes are combined over the whole region of the active layer 140, thereby improving the internal quantum efficiency.

In the light emitting device 100, when a reverse voltage or an instantaneous voltage due to static electricity is applied to the first conductive type semiconductor layer 130, the voltage may be distributed into the whole region by the second conductive layer 132 and the third conductive layer 133. Thus, Electro-Static Discharge (ESD) tolerance may be increased, thereby increasing the lifespan and reliability of a device.

The current spreading structure may be disposed to be spaced from each other. That is, the pair of the second conductive layer 132 and the third conductive layer 133 may be disposed to be spaced from other pairs. Here, a normal conductive layer may be further disposed between adjacent current spreading structures. The normal conductive layer may be so thinly formed as not to inhibit the current spreading.

Figure 3:
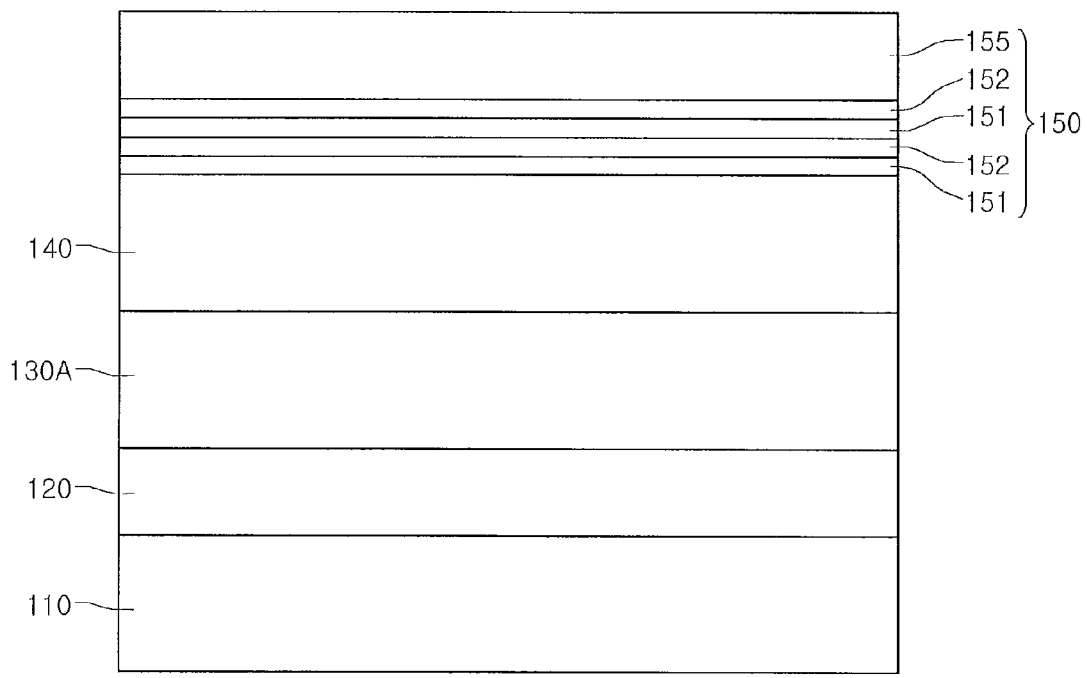
FIG. 3 is a side cross-sectional view illustrating a light emitting device according to a second embodiment.
Figure 4:
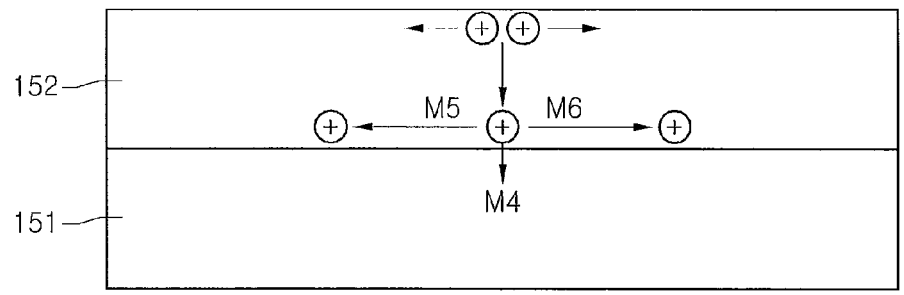
FIG. 4 is a view illustrating a current movement state in a fourth conductive layer and a fifth conductive layer of FIG. 3.

FIG. 3 is a side cross-sectional view illustrating a light emitting device according to a second embodiment. FIG. 4 is a view illustrating a current movement state in a fourth conductive layer and a fifth conductive layer of FIG. 3. Parts of the second embodiment identical to those of the first embodiment will be described by referring to the first embodiment.

Referring to FIG. 3, a light emitting device 100A may include a substrate 110, a compound semiconductor layer 120, a first conductive type semiconductor layer 130A, an active layer 140, and a second conductive type semiconductor layer 150 having a current spreading structure. The current spreading structure of the second conductive type semiconductor layer 150 may serve to spread an applied current, and may include layers with different dopant concentrations.

The second conductive type semiconductor layer 150 may include fourth to sixth conductive layers 151, 152 and 155. The fourth and fifth conductive layer 151 and 152, which form a current spreading structure of the second conductive type semiconductor layer 150, may be disposed to be close or adjacent to the active layer 140.

The lowest layer contacting the active layer 140 may be the fourth conductive layer 151 or the fifth conductive layer 152, preferably, the fifth conductive layer 151.

A pair of the fourth and fifth conductive layers 151 and 152 may be formed in about 1 to about 50 cycles, but the number of any one of the fourth and fifth conductive layers 151 and 152 may be greater than that of the other layer. The thickness of the current spreading structure, which is the total thickness of the fourth and fifth conductive layers 151 and 152, may range from about 100 Å to about 300 Å. The fourth conductive layer 151 may be formed to have a thickness greater than that of the fifth conductive layer 152.

The fourth conductive layer 151 may become a low conductive layer, high resistive layer, or a low concentration layer with respect to the fifth conductive layer 152. The fourth conductive layer 151 may be doped with a second conductive type dopant, and may be formed at a hole concentration of about $1\sim5\times10^{15}$ cm$^{-3}$ or less. The fourth conductive layer 151 may also be doped with a first conductive type dopant, or may not be doped with a conductive type dopant.

The fifth conductive layer 152 may become a high conductive layer, a low resistive layer, or a high concentration layer with respect to the fourth conductive layer 152. The fifth conductive layer 152 may be doped with a second conductive type dopant at a hole concentration of about $3\sim8\times10^{17}$ cm$^{-3}$ or more.

The sheet resistivity of the fourth conductive layer 151 may range from about 200K Ω/sq to about 600K Ω/sq. The sheet resistivity of the fifth conductive layer 152 may range from about 10K Ω/sq to about 15K Ω/sq.

The fourth conductive layer 151 may be formed of at least one of GaN, InN, AlN, InGaN, AlGaN, InAlGaN, and AlInN. The fifth conductive layer 152 may be formed of at least one of GaN, InN, AlN, InGaN, AlGaN, InAlGaN, and AlInN. The semiconductor materials of the fourth and fifth conductive layers 151 and 152 may be identical to or different from each other.

The sixth conductive layer 155 on the fifth conductive layer 152 may be a p-type semiconductor layer with a normal concentration or a p-type semiconductor layer with a high concentration. Here, the p-type semiconductor layer with the normal concentration may be doped at a hole concentration of about $1\sim9\times10^{17}$ cm$^{-3}$ or more. The sixth conductive layer 155 may have conductivity characteristics between the fourth conductive layer 151 and the fifth conductive layer 152, but embodiments are not limited thereto.

The criterion of determining whether to be a high conductive layer (e.g., 152) or a low conductive layer (e.g., 151) in the second conductive type semiconductor layer 150 may depends on whether to be a high conductive or a low conductive with respect to a p-type semiconductor layer with a normal concentration, for example, the sixth conductive layer 155.

When a current is supplied to the second conductive type semiconductor layer 150, the current may be supplied to the active layer 140 through the sixth conductive layer 155 and the stacked structure of the fifth conductive layer 152 and the fourth conductive layer 151. In this case, the fourth conductive layer 151 may make horizontal current movement more active than vertical current movement in the fifth conductive layer 152. The current may be spread by the current spreading structure of the fifth conductive layer 152 and the fourth conductive layer 151 stacked in a cycle, and may be supplied to the active layer 140.

Referring to FIG. 4, carriers, e.g., holes (+) of the fifth conductive layer 152 may be moved in horizontal and vertical directions. The holes (+) of the fifth conductive layer 152 may show horizontal movement M5 and M6 distribution greater than movement M4 distribution to the fourth conductive layer 151, which represents current spreading. The distribution may be a quantity or velocity of current movement.

Since the fourth conductive layer 151 with a low concentration is disposed under the fifth conductive layer 152 with high concentration, the carriers of the fifth conductive layer 152 may be spread to the whole of the layer, and may be uniformly distributed over the whole region of the layer. Also, when the fifth conductive layer 152 and the fourth conductive layer 151 are repeatedly stacked in several cycles, a current may be more broadly spread.

The second embodiment may include a plurality of current spreading structures spaced from each other. For example, a first pair of the fifth conductive layer 152 and the fourth conductive layer 151 and a second pair of the fifth conductive layer 152 and the fourth conductive layer 151 may further include a normal conductive layer therebetween. The normal conductive layer may be so thinly formed as not to inhibit the current spreading.

Figure 5:
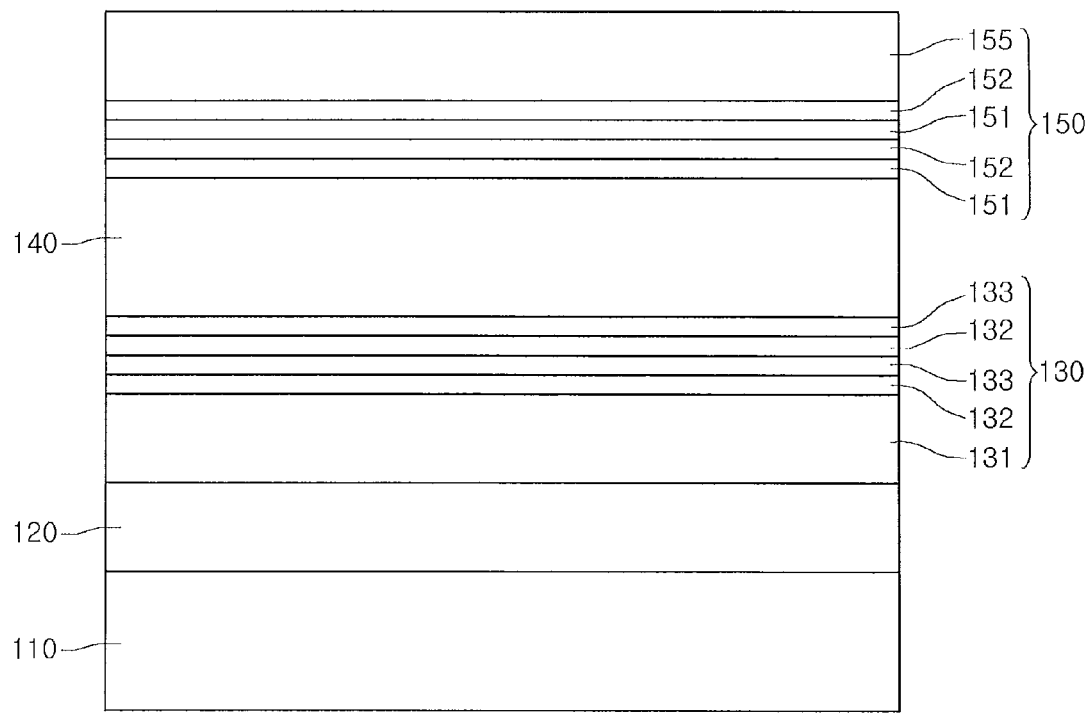
FIG. 5 is a side cross-sectional view illustrating a light emitting device according to a third embodiment.

FIG. 5 is a side cross-sectional view illustrating a light emitting device according to a third embodiment. Parts of the third embodiment identical to those of the first and second embodiments will be described by referring to the first and second embodiments.

Referring to FIG. 5, a light emitting device 100B may include a substrate 110, a compound semiconductor layer 120, a first conductive type semiconductor layer 130 having a current spreading structure, an active layer 140, and a second conductive type semiconductor layer 150 having a current spreading structure.

The first conductive type semiconductor layer 130 may include first to third conductive layers 131, 132 and 133. The second and third conductive layers 132 and 133 may inhibit vertical current movement and activate horizontal current movement. That is, the second conductive layer 132 may be doped with a first conductive type dopant at a high concentration, and the third conductive layer 133 may be doped with a first conductive type dopant at a low concentration. Also, the second and third conductive layers 132 and 133 are repeatedly stacked in multiple cycles (e.g., about 2 to about 50), a current may be spread and supplied in a horizontal direction in the first conductive type semiconductor layer 130.

The second conductive type semiconductor layer 150 may include fourth to sixth conductive layers 151, 152 and 155. The fourth and fifth conductive layers 151 and 152 may be repeated in a cycle. The sixth conductive layer 155 may be disposed on the last cycle of the fourth conductive layer 151 and the fifth conductive layer 152.

The fourth conductive layer 151 may include a second conductive type dopant with a low concentration, and the fifth conductive layer 152 may include a second conductive type dopant with a high concentration. The sixth conductive type layer 155 may include a second conductive type dopant with a normal concentration between a high concentration and a low concentration, but embodiments are not limited thereto.

When a current is supplied to the fifth conductive layer 152 through the sixth conductive layer 155, the current may be spread in a horizontal direction in the fifth conductive layer 152 by the fourth conductive layer 151, and thus the spread current may be supplied to the active layer 140. Since the cycle of the fifth conductive layer 152 and the fourth conductive layer 151 is repeated in multiple cycles (about 2 to about 50), the current may be more broadly spread in a uniform distribution.

Meanwhile, a third conductive layer 133 may be disposed at the uppermost layer of the first conductive type semiconductor layer 130. The fourth conductive layer 151 or the fifth conductive layer 152 may be disposed at the lowest layer of the second conductive type semiconductor layer 150, but embodiments are not limited thereto.

Electrons and hole may be combined in a uniform distribution at the whole region of the active layer 140, thereby improving optical efficiency. Thus, the light emitting efficiency of the light emitting device 100B can be improved.

Figure 6:
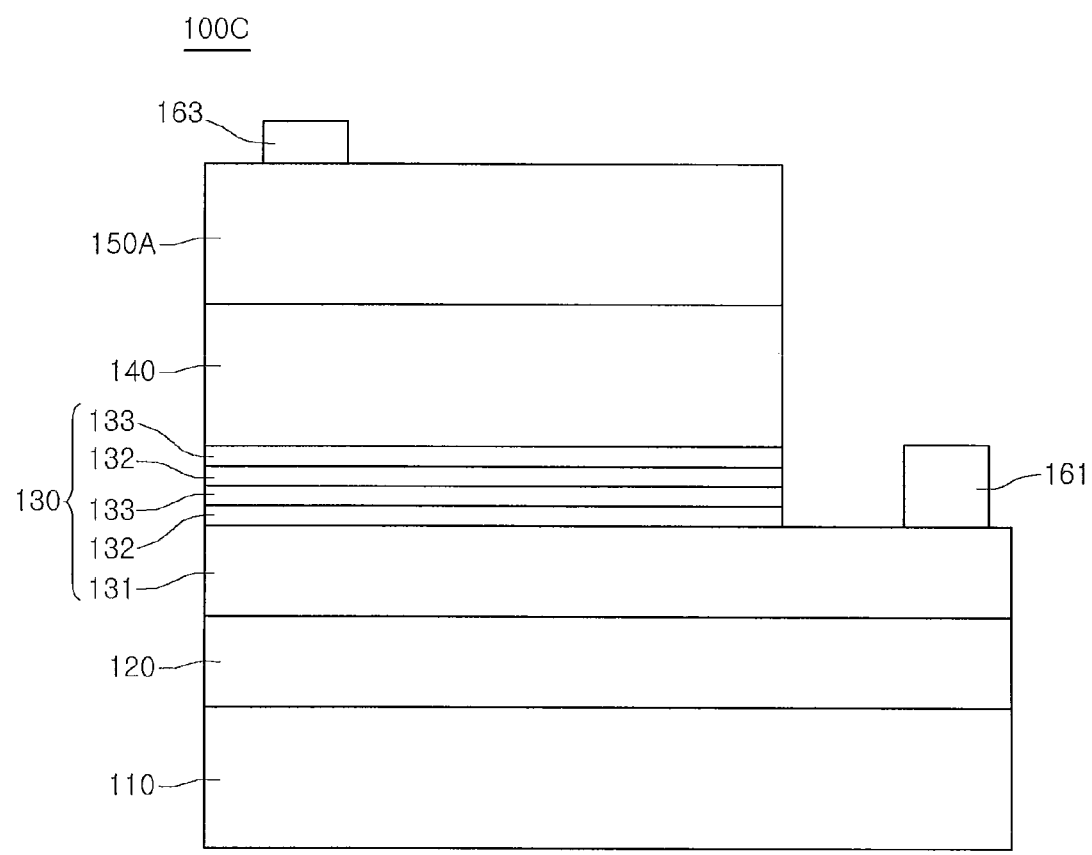
FIG. 6 is a side cross-sectional view illustrating the light emitting device of FIG. 1.

FIG. 6 is a side cross-sectional view illustrating the light emitting device of FIG. 1. For explanation of FIG. 5, detailed description of components identical to those described above will be omitted below.

Referring to FIG. 6, a light emitting device 100C may include a first electrode 171 on a first conductive type semiconductor layer 130, and a second electrode 163 on a second conductive type semiconductor layer 150A.

Here, a mesa etching may be performed on a portion of the first conductive type semiconductor layer 130. The mesa etching may be performed to a certain depth to expose a first conductive layer 131 of the first conductive type semiconductor layer 130. That is, the mesa etching depth may be beneath a current spreading structure (i.e., 132 and 133). The first electrode 161 may be disposed beneath the current spreading structure. The first electrodes 161 may be formed in singularity or plurality on the first conductive layer 131.

The first electrode layer 131 of the first conductive type semiconductor layer 130 may be supplied with a current through the first electrode 161 disposed at one side thereof. The current spreading structure, the second and third conductive layers 132 and 133 may allow the supplied current to be spread to the whole region.

The second conductive type semiconductor layer 163 and the second electrode 163 may include an n-type semiconductor layer and/or an electrode layer disposed therebetween, but embodiments are not limited thereto.

The second electrode 163 may include a pad. The second electrode 163 may has an electrode pattern of a finger shape or a branched shape. Such an electrode pattern may allow an applied current to be spread.

Current crowding may occur in a semiconductor chip having a large area of, for example, about 500 um×500 um or more and a thickness of about 10 um or less. Such current crowding may be overcome by a current spreading structure.

A current applied through the first electrode 161 formed at one side of the first conductive type semiconductor layer 130 of the light emitting device 100C may be spread to the whole region of the first conductive type semiconductor layer 130, and may be injected into an active layer 140. The current spreading effect may improve optical efficiency, and may provide a device having a strong ESD tolerance.

Figure 7:
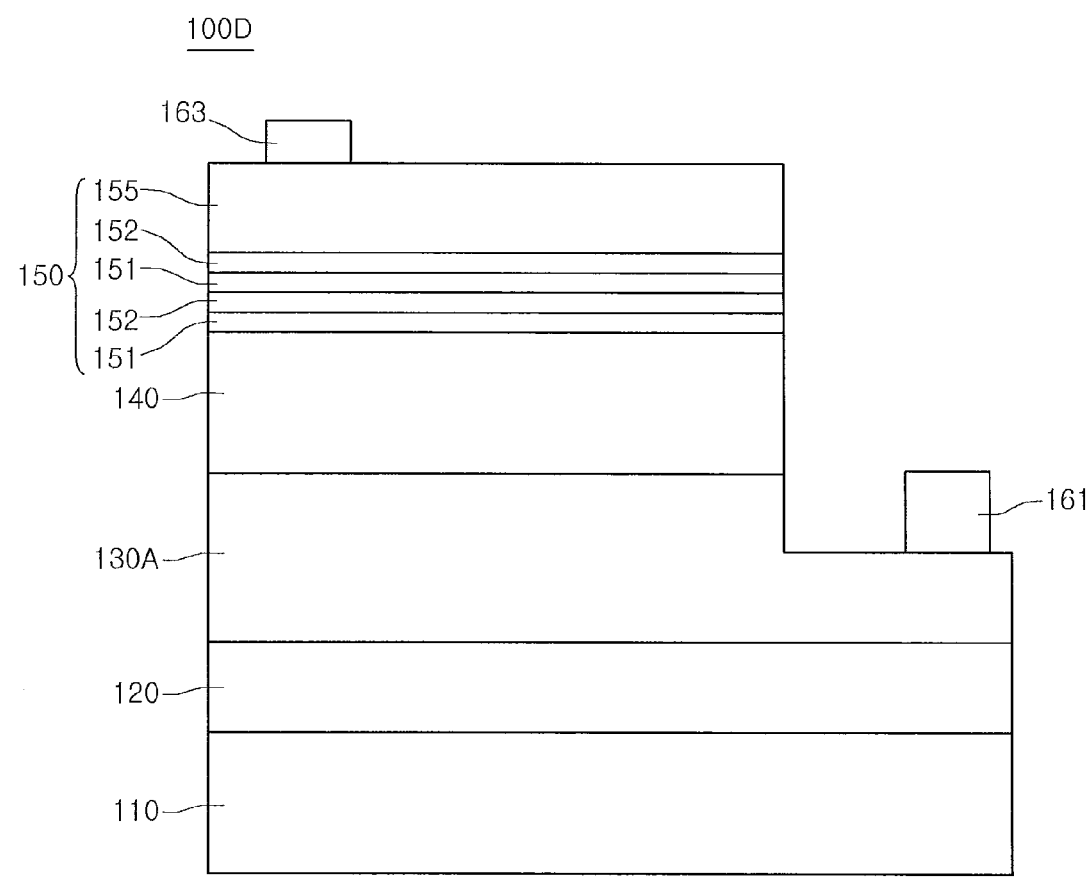
FIG. 7 is a side cross-sectional view illustrating the light emitting device of FIG. 3.

FIG. 7 is a side cross-sectional view illustrating the light emitting device of FIG. 3. For explanation of FIG. 7, detailed description of components identical to those described above will be omitted below.

Referring to FIG. 7, a light emitting device 100D may include a first electrode 161 on a first conductive type semiconductor layer 130A, and a second electrode 163 on a second conductive type semiconductor layer 150A having a current spreading structure. Detailed description of the current spreading structure will be replaced with that of FIG. 3.

Figure 8:
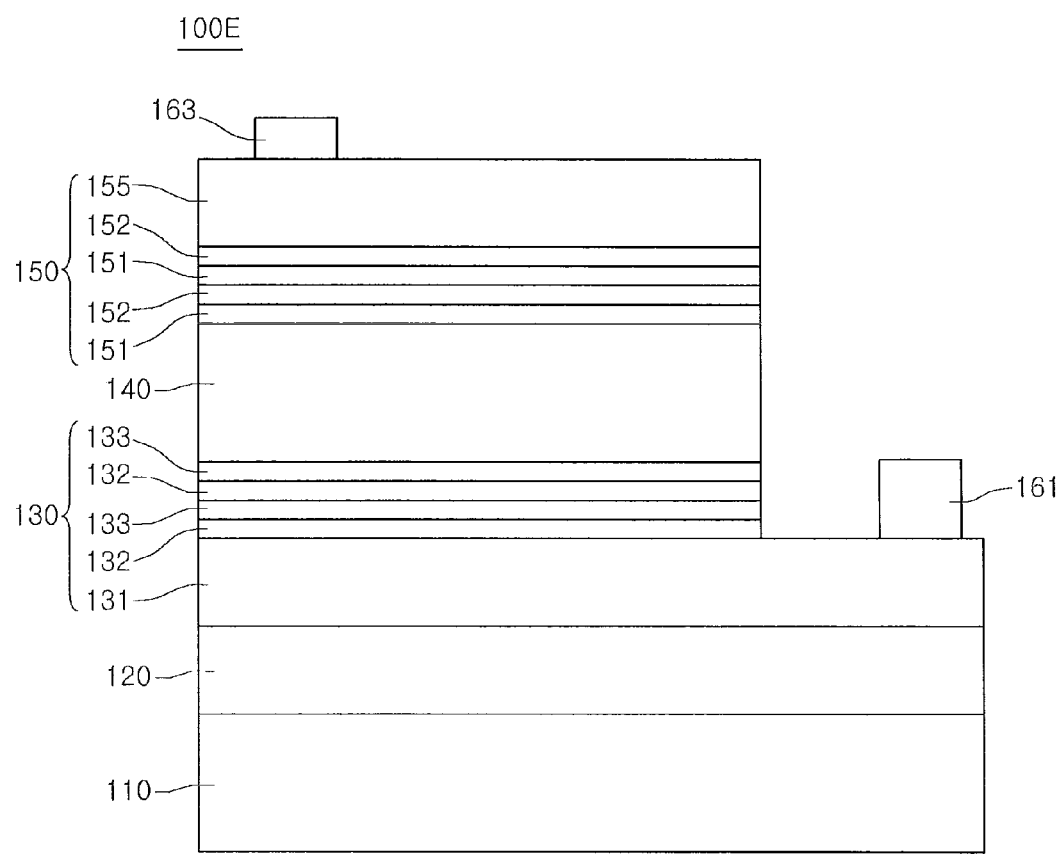
FIG. 8 is a side cross-sectional view illustrating the light emitting device of FIG. 5.

FIG. 8 is a side cross-sectional view illustrating the light emitting device of FIG. 5. For explanation of FIG. 8, detailed description of components identical to those described above will be omitted below.

Referring to FIG. 8, a light emitting device 100E may include a first electrode 161 on a first conductive type semiconductor layer 130 having a current spreading structure, and a second electrode 163 on a second conductive type semiconductor layer 150A having a current spreading structure. Detailed description of the current spreading structure will be replaced with that of FIG. 5.

Figure 9:
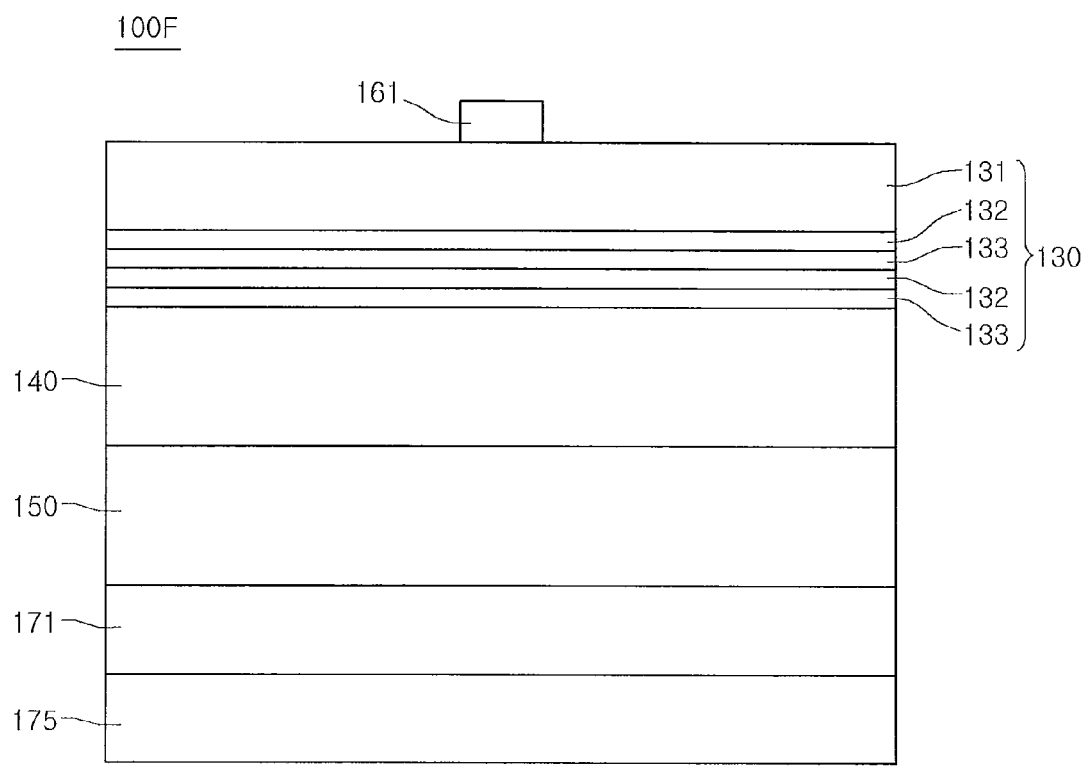
FIG. 9 is a side cross-sectional view illustrating the light emitting device of FIG. 1.

FIG. 9 is a side cross-sectional view illustrating the light emitting device of FIG. 1. For explanation of FIG. 9, detailed description of components identical to those described above will be omitted below.

Referring to FIG. 9, a light emitting device 100F may include a reflection electrode layer 171 under a second conductive type semiconductor layer 150A of the light emitting device like FIG. 1, and a conductive supporting member under the reflection electrode layer 171. The reflection electrode layer 171 may include at least one of Al, Ag, Pd, Rh, Pt, Ir and an alloy thereof, and the conductive supporting member 175 may be formed of copper (Cu), gold (Au), nickel (Ni), molybdenum (Mo), Cu—W, carrier wafer (e.g., Si, Ge, GaAs, ZnO, SiC, etc), but is not limited thereto.

Thereafter, the substrate (110 of FIG. 1) and the undoped semiconductor layer (120 of FIG. 1) may be removed through physical and/or chemical methods. Here, the physical removal method may include a Laser Lift Off (LLO) that irradiates a laser with a specific wavelength on the substrate (110 of FIG. 1). The chemical removal method may include removing the substrate and undoped semiconductor layer by injecting an etchant into the undoped semiconductor layer (120 of FIG. 1).

A first electrode 161 may be disposed on the first conductive type semiconductor layer 130. The first electrode 161 may be formed to have at least one or a certain electrode pattern. The first conductive type semiconductor layer 130 may be formed to have a surface of an unevenness, roughness, or certain pattern, but is not limited thereto.

A current applied from the first electrode 161 to the first conductive type semiconductor layer 130 may be spread to the whole region by a second conductive layer 132 and a third conductive layer 133 to be supplied to an active layer 140. Thus, internal quantum efficiency can be improved, and a device strong to ESD can be provided.

Figure 10:
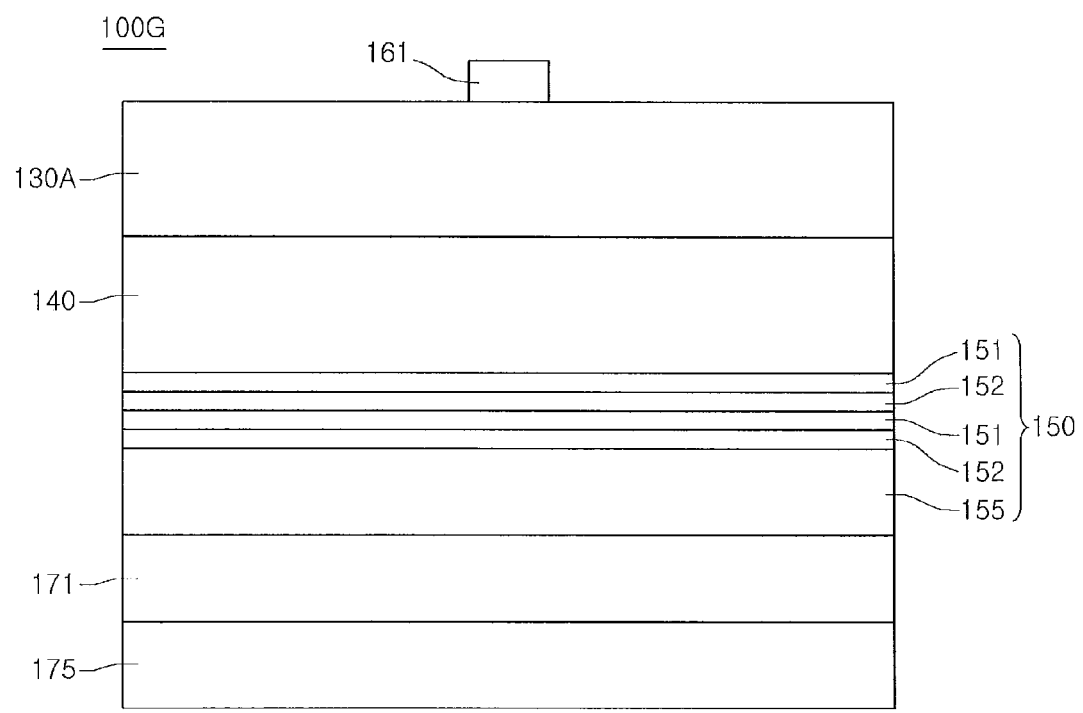
FIG. 10 is a side cross-sectional view illustrating the light emitting device of FIG. 3.

FIG. 10 is a side cross-sectional view illustrating the light emitting device of FIG. 3. For explanation of FIG. 10, detailed description of components identical to those described above will be omitted below.

Referring to FIG. 10, a reflection electrode layer 171 and a conductive supporting member 175 may be formed under a second conductive type semiconductor layer 150 in a light emitting device 100G, and then the substrate and the undoped semiconductor layer of FIG. 5 may removed. A first electrode 161 may be disposed on the first conductive type semiconductor layer 130A.

In the second conductive type semiconductor layer 150, a fourth conductive layer 151 may inhibit vertical current movement, and a fifth conductive layer 152 may facilitate horizontal current movement, thereby supplying current to the whole region of an active layer 140 in uniform distribution.

Figure 11:
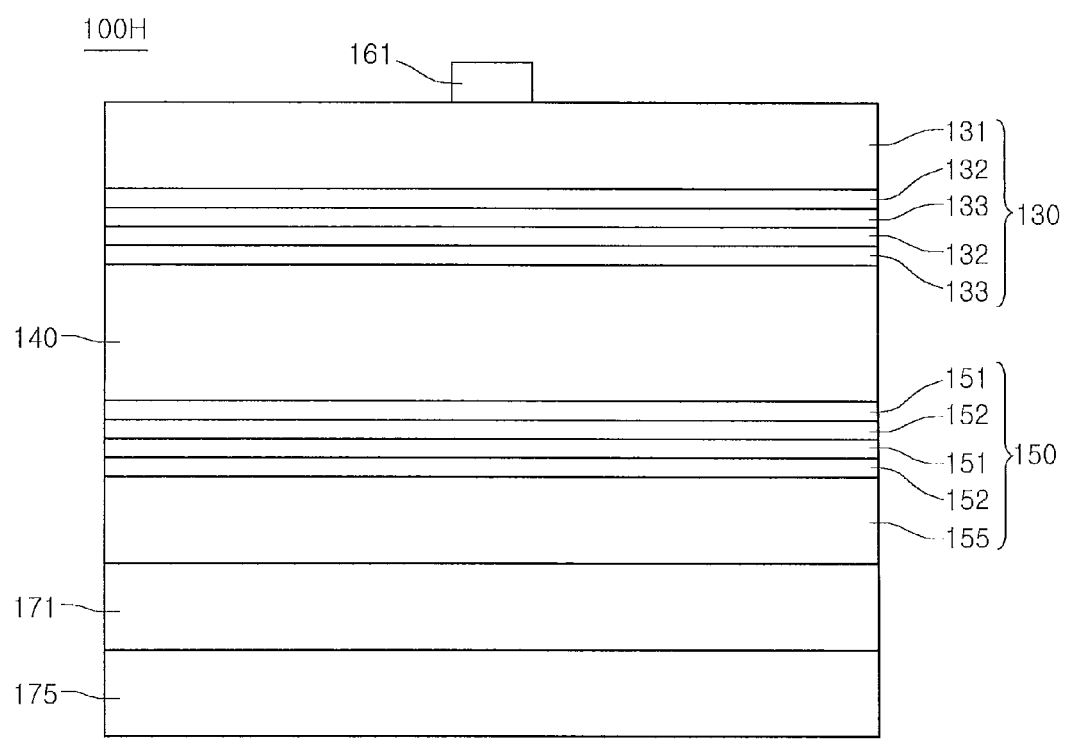
FIG. 11 is a side cross-sectional view illustrating the light emitting device of FIG. 5.

FIG. 11 is a side cross-sectional view illustrating the light emitting device of FIG. 5. For explanation of FIG. 11, detailed description of components identical to those described above will be omitted below.

Referring to FIG. 11, a light emitting device 100H may have current spreading structures formed in a first conductive type semiconductor layer 130 and a second conductive type semiconductor layer 150.

The first conductive type semiconductor layer 130 may inhibit vertical current movement by a third conductive layer 133, and may facilitate horizontal current movement by a second conductive layer 132. Accordingly, a current supplied to the first conductive type semiconductor layer 130 can be spread to the whole region.

In the second conductive type semiconductor layer 150, a fourth conductive layer 151 may inhibit vertical current movement, and a fifth conductive layer 152 may facilitate horizontal current movement, thereby supplying a current to the whole region in uniform distribution.

Figure 12:
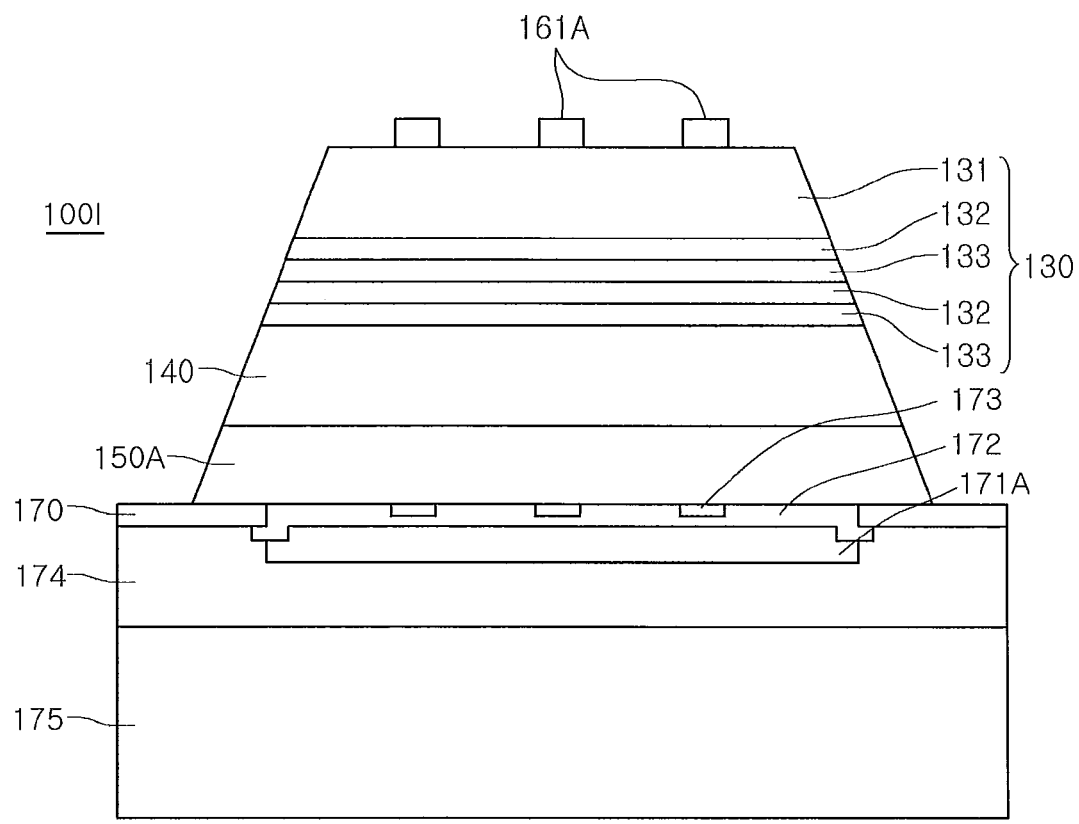
FIG. 12 is a side cross-sectional view illustrating the light emitting device of FIG. 1.

FIG. 12 shows a modified example of FIG. 9. For explanation of FIG. 12, detailed description of components identical to those described above will be omitted below.

Referring to FIG. 12, a light emitting device 100I may include a channel layer 170, an ohmic layer 172, a current blocking layer 173, a reflection electrode layer 171A, a junction layer 174, and a conductive supporting member 175 under a second conductive type semiconductor layer 150A of the light emitting device 100 as described in FIG. 1.

A first conductive type semiconductor layer 130 may include a first conductive layer 131 with a normal concentration, a second conductive layer 132 with a high concentration, and a third conductive layer 133 with a lower concentration.

A first electrode 161A with a plurality of patterns may be disposed on the first conductive type semiconductor layer 130. The first conductive type semiconductor layer 130 may be formed to have a surface of an unevenness, roughness, or certain pattern.

The first conductive type semiconductor layer 130, the active layer 140, and the second conductive type semiconductor layer 150A may be formed to have an inclined surface, but embodiments are not limited thereto.

The channel layer 170 and the ohmic layer 172 may be disposed under the second conductive type semiconductor layer 130.

The channel layer 170 may be formed to have a shape of loop, ring, or frame around the undersurface of the second conductive semiconductor layer 150A. The channel layer 170 may include a shape of a continuous or discontinuous pattern.

The channel layer 170 may be selected from materials having a refractive index smaller than a compound semiconductor of group III to group V elements such as light-transmittance oxide, light-transmittance nitride, or light-transmittance insulating layer. The channel layer 170 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SiO2, SiOx, $SiO_xN_y$, $Si_3N_4$, $Al_2O_3$, and $TiO_2$.

The channel layer 170 may inhibit short-circuit to provide an LED strong to high humidity even though the outer walls of the semiconductor layer 130, 140 and 150A are exposed to humidity.

The channel layer 170 may make the semiconductor layer 130, 140 and 150A spaced from other metal layers, for example, the junction layer 174.

The ohmic layer 172 may disposed under the second conductive type semiconductor layer 150A. The ohmic layer 172 may be connected to the undersurface of the second conductive type semiconductor layer 150A by ohmic contact. The ohmic layer 172 may be extend to the bottom of the channel layer 170, but is not limited thereto. The ohmic layer 172 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO, Pt, Ni, Au, Rh, Pd.

The current blocking layer 173 may be disposed under the second conductive type semiconductor layer 150A. The current blocking layer 173 may have a pattern, and may be formed corresponding to the pattern of the first electrode 161A. The current blocking layer 173 may be formed of a material having an electrical conductivity lower than the ohmic layer 172. The current blocking layer 173 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SiO2, SiOx, $SiO_xN_y$, $Si_3N_4$, and $Al_2O_3$, $TiO_2$.

The reflection electrode layer 172A may be disposed under the ohmic layer 172, and may reflect incident light. The reflection electrode layer 171A may be formed of at least one of Ag, Ni, Al, Rh, Pd, Ir, Ru, Mg, Zn, Pt, Au, Hf, and an alloy thereof. The reflection electrode layer 171A may include a seed metal that is used for a plating processing. Thus, the reflection electrode layer 171A may selectively include an ohmic layer, a seed layer, and an electrode layer. In this case, an ohmic layer may not include an indium tin oxide (ITO).

The reflection electrode layer 171A may cover the whole of the undersurface of the channel layer 170 or about 80% or less of the undersurface of the channel layer 170.

The reflection electrode layer 171A may be formed to have a width (i.e., diameter) greater than the active layer. In this case, incident light may be effectively reflected, and thus optical extraction efficiency can be improved.

The junction layer 174 may be formed under the reflection electrode layer 171A and the channel layer, but is not limited thereto. The junction layer 174 may include a barrier metal or a bonding metal. For example, the junction layer 174 may include at least one of Ti, Au, Sn, Ni, Cr, Ga, In, Bi, Cu, Ag, and Ta.

The junction layer 174 may serve as a bonding layer. The conductive supporting member 175 may be bonded to the undersurface of the junction layer 174. Alternatively, the junction layer 174 may not be disposed, and instead the conductive supporting member 175 may be bonded to the reflection electrode layer 171A using a plating or a sheet.

The conductive supporting member 175, which is a base substrate, may include Cu, Au, Ni, Mo, Cu—W, carrier wafer (e.g., Si, Ge, GaAs, ZnO, SiC, SiGe, GaN, etc). Alternatively, the conductive supporting member 170 may not be formed, or may be implemented with a conductive sheet.

The outer side of the semiconductor layer 130, 140 and 150A may be covered with an insulating material. Examples of the insulating materials may include $SiO_2$, $SiO_x$, $SiO_xN_y$, $Si_3N_4$, $Al_2O_3$, $TiO_2$, which are materials having a refractive index smaller than that (e.g., GaN: 2.4) of the compound semiconductor.

For explanation of the above embodiments, since a current spreading structure of high conductive layer/low conductive layer stacked with respect to a current applied direction is formed in the first conductive type semiconductor layer and/or the second conductive type semiconductor layer, a current can be uniformly spread to the whole region without being significantly affected by the formation location and size of a first electrode or a second electrode. Also, since a current spreading structure including a stacked structure of high conductive layer/low conductive layer is formed in at least one of the conductive semiconductor layers on/under the active layer, electrons and/or holes can be uniformly distributed over the whole of the layer, thereby improving the light emitting efficiency in the active layer.

Figure 13:
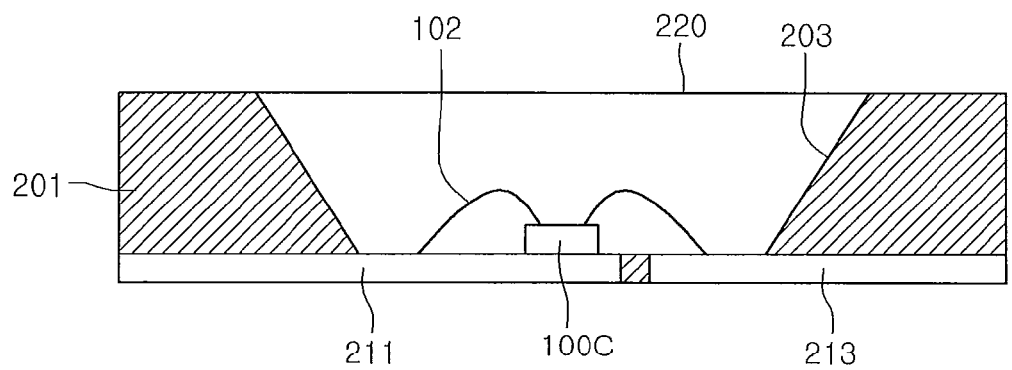
FIG. 13 is a view illustrating a light emitting device package including the light emitting device of FIG. 6.

FIG. 13 is a view illustrating a light emitting device package including the light emitting device of FIG. 6. For explanation of FIG. 13, the configuration of the light emitting device will be referred to below.

Referring to FIG. 13, a light emitting package 200 may include a body part 201, a first lead electrode 211 and a second lead electrode 213 installed in the body part 201, a light emitting device 100C installed in the body part 201 and electrically connected to the first and second lead electrodes 211 and 213, and a molding member surrounding the light emitting device 100C.

The body part 201 may be formed of a material such as silicon, resin, or metal. The light emitting device 100C may have an inclined surface formed therearound. The body part 201 may have a cavity 203 opened upwardly, but embodiments are not limited thereto.

The first and second lead electrodes 211 and 213 may be electrically separated from each other, and may provide power to the light emitting device 100C. Also, the first and second lead electrodes 211 and 213 may reflect light generated in the light emitting device 100c, thereby increasing optical efficiency, and exhausting heat generated in the light emitting device 100C to the outside.

The light emitting device 100C may be installed on the body part 201, or the first lead electrode 211 or the second lead electrode 213.

The light emitting device 100C may be electrically connected to the first and second lead electrodes 211 and 213 through a wire 102. In an embodiment, the light emitting devices of FIGS. 7 to 12 may be selective applied besides the light emitting device 100C. Such a light emitting device may be mounted through at least one of wire, die bonding, and flip bonding methods, but embodiments are not limited thereto.

The molding member 220 may surround the light emitting device 100C to protect the light emitting device 100C. Also, the molding member 220 may include a fluorescent substance, thereby changing the wavelength of light emitted from the light emitting device 100C.

Light emitting devices according to the above embodiments may be packaged in a ceramic substrate, a semiconductor substrate, and an insulating substrate such as resin or silicon, and may be used as light sources such as indicating devices, lighting devices, and displaying devices. Also, the respective embodiments are not limited thereto, but can be selectively applied other embodiments disclosed above.

Embodiments can improve current spreading, as well as electrical and optical efficiency. Embodiments can also provide a device strong to ESD tolerance.

Another embodiment provides a lighting system which comprises the light emitting device described above. The lighting system may include lamp, street light, light unit not limited thereto.

Embodiments exemplify a compound light emitting device with an N-P junction structure exemplarily, but may be implemented in a compound light emitting device with an N-P-N, P-N, or P-N-P structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a substrate;
a compound semiconductor layer including a plurality of semiconductor layers on a top surface of the substrate;
a first conductive type semiconductor layer on a top surface of the compound semiconductor layer;
a first electrode connected to the first conductive type semiconductor layer;
a second conductive type semiconductor layer;
a second electrode connected to the second conductive type semiconductor layer; and
an active layer between the first conductive type semiconductor layer and the second conductive type semiconductor layer,
wherein the first conductive type semiconductor layer comprises a first current spreading structure comprising at least one pair of a first conductive layer and a second conductive layer, a conductivity of the first conductive layer is higher than a conductivity of the second conductive layer, and the first current spreading structure is disposed in a sequence of the second conductive layer and the first conductive layer from the active layer,
wherein the first conductive type semiconductor layer comprises a third conductive layer disposed between the compound semiconductor layer and the first current spreading structure,
wherein the at least one pair of the first conductive layer and the second conductive layer is disposed between the third conductive layer and the active layer,
wherein the third conductive layer has a dopant concentration between a dopant concentration of the first conductive layer and a dopant concentration of the second conductive layer,
wherein the third conductive layer physically contacts a bottom surface of the first current spreading structure and a bottom surface of the first electrode,
wherein the bottom surface of the first electrode is located at a position lower than an entire region of the first current spreading structure,
wherein the third conductive layer is located at a position lower than the entire region of the first current spreading structure,
wherein a conductivity of the third conductive layer is higher than the conductivity of the second conductive layer,
wherein the first and third conductive layers have a difference of dopant concentration of about $1 \times 10^{18}$ cm$^{-3}$ or more,
wherein the first to third conductive layers comprise an N-type dopant, wherein the first to third conductive layers include different dopant concentrations from each other, wherein the second conductive layer has a thickness greater than a thickness of the first conductive layer, wherein the dopant concentration of the second conductive layer is about $1\sim5\times10^{15}$ cm$^{-3}$ or less, and wherein the pair of the first conductive layer and the second conductive layer is stacked in cycles of about 2 to about 50.

2. The light emitting device according to claim 1, wherein a concentration of the N-type dopant of the first conductive layer is about $5\sim9\times10^{18}$ cm$^{-3}$ or more.

3. The light emitting device according to claim 2, wherein the first current spreading structure has a thickness of about 500 Å to about 1,000 Å.

4. The light emitting device according to claim 2,
wherein the first and second conductive layers have a difference of dopant concentrations of about $1\times10^3$ cm$^{-3}$ or more.

5. The light emitting device according to claim 1, wherein the first and second conductive layers are formed of a different material from each other.

6. The light emitting device according to claim 5, wherein the first and second conductive layers are formed of at least one of GaN, InN, AlN, InGaN, AlGaN, InAlGaN, and AlInN.

7. The light emitting device according to claim 1, wherein the compound semiconductor layer includes a buffer layer contacted with the top surface of the substrate and an undoped semiconductor layer contacted with the third conductive layer and the buffer layer.

8. The light emitting device according to claim 1, further comprising a first conductive cladding layer between the active layer and the first conductive type semiconductor layer.

9. The light emitting device according to claim 8, wherein the third conductive layer physically contacts the second conductive layer.

10. The light emitting device according to claim 1, wherein the third conductive layer physically contacts the second conductive layer.

11. The light emitting device according to claim 1, wherein the second conductive type semiconductor layer includes a second current spreading structure in the second conductive type semiconductor layer,
wherein the second current spreading structure includes at least one pair of a fourth conductive layer and a fifth conductive layer, a conductivity of the fourth conductive layer is higher than a conductivity of the fifth conductive layer, and the second current spreading structure is disposed in a sequence of the fifth conductive layer and the fourth conductive layer from the active layer,
wherein the second conductive type semiconductor layer includes a sixth conductive layer physically contacted with the second electrode, and
wherein the fourth to sixth conductive layers include different dopant concentrations from each other.

12. The light emitting device according to claim 11, wherein the second current spreading structure has a thickness of about 100 Å to about 300 Å.

13. A light emitting device, comprising:
a first conductive type semiconductor layer;
a first electrode connected to the first conductive type semiconductor layer;
a second conductive type semiconductor layer; and
an active layer between the first conductive type semiconductor layer and the second conductive type semiconductor layer, wherein the first conductive type semiconductor layer comprises a first current spreading structure comprising at least one pair of a first conductive layer and a second conductive layer, a conductivity of the first conductive layer is higher than a conductivity of the second conductive layer, and the first current spreading structure is disposed in a sequence of the second conductive layer and the first conductive layer from the active layer, wherein the first conductive type semiconductor layer and the second conductive type semiconductor layer are formed of a nitride-based semiconductor layer, wherein the first conductive layer is doped with a first conductive type dopant, wherein the second conductive layer is not doped with any conductive type dopant, wherein the second conductive layer has a thickness greater than a thickness of the first conductive layer, wherein the pair of the first conductive layer and the second conductive layer are stacked in cycles of about 2 to about 50, wherein the first and second conductive layers have a difference of dopant concentrations of about $1\times10^3$ cm$^{-3}$ or more, wherein the first conductive type semiconductor layer comprises a third conductive layer disposed under an entire region of the first current spreading structure, wherein the third conductive layer has a dopant concentration between a dopant concentration of the first conductive layer and a dopant concentration of the second conductive layer, wherein the third conductive layer physically contacts the first current spreading structure and the first electrode, wherein a bottom surface of the first electrode is located at a position lower than the entire region of the first current spreading structure, wherein the first to third conductive layers include different dopant concentrations from each other, wherein a conductivity of the third conductive layer is higher than the conductivity of the second conductive layer, wherein the first and third conductive layers have a difference of dopant concentration of about $1\times10^{18}$ cm$^{-3}$ or more, and wherein the first, second and third conductive layers include an N-type dopant.

14. The light emitting device according to claim 13,
wherein the second conductive type semiconductor layer comprises a second current spreading structure including at least one pair of a fourth conductive layer and a fifth conductive layer, a conductivity of the fourth conductive layer is higher than a conductivity of the fifth conductive layer, and the second current spreading structure is disposed in a sequence of the fifth conductive layer and the fourth conductive layer from the active layer, wherein the second conductive type semiconductor layer includes a sixth conductive layer physically contacted with the second electrode, wherein the fourth to sixth conductive layers include different dopant concentrations from each other, wherein the at least one pair of the first conductive layer and the second conductive layer of the first current spreading structure has a thickness greater than a thickness of the at least one pair of the fourth conductive layer and the fifth conductive layer of the second current spreading structure, wherein the fourth conductive layer has a hole concentration of about $3\sim8\times10^{17}$ cm$^{-3}$ or more, and the fifth conductive layer has a hole concentration of about $1\sim5\times10^{15}$ cm$^{-3}$ or less, wherein the pair of the fourth conductive layer and the fifth conductive layer are stacked in cycles of about 2 to about 50, wherein the fifth conductive layer has a thickness greater than a thickness of the fourth conductive layer, and wherein the fourth, fifth and sixth conductive layers include a P-type dopant.

15. The light emitting device according to claim 14, wherein the first and second conductive layers are formed of a different material from each other.

16. A light emitting device, comprising:
a first conductive type semiconductor layer having a first current spread structure comprising a pair of a first conductive layer and a second conductive layer under the first conductive layer, wherein a conductivity of the first conductive layer is higher than a conductivity of the second conductive layer;
a first electrode on a top surface of the first conductive type semiconductor layer;
an active layer under the first conductive type semiconductor layer;
a second conductive type semiconductor layer including at least three layers under the active layer; and
an electrode layer under a bottom surface of the second conductive type semiconductor layer,
wherein the first conductive type semiconductor layer comprises a third conductive layer contacted between the first current spread structure and the first electrode,
wherein the third conductive layer has a dopant concentration different from a dopant concentration of the first conductive layer and a dopant concentration of the second conductive layer,
wherein a bottom surface of the first electrode is located at a higher position than an entire region of the first current spreading structure,
wherein the third conductive layer is located at a higher position than the entire region of the first current spreading structure,
wherein a conductivity of the third conductive layer is higher than the conductivity of the second conductive layer,
wherein the first and third conductive layers have a difference of dopant concentration of about $1\times10^{18}$ cm$^{-3}$ or more,
wherein the second conductive layer has a thickness greater than a thickness of the first conductive layer,
wherein the dopant concentration of the second conductive layer is about $1\sim5\times10^{15}$ cm$^{-3}$ or less,
wherein the first conductive layer comprises a first conductive type dopant at a concentration of about $5\sim9\times10^{18}$ cm$^{-3}$ or more,
wherein the pair of the first conductive layer and the second conductive layer are stacked in cycles of about 2 to about 50,
wherein the first and second conductive layers have a difference of dopant concentrations of about $1\times10^{3}$ cm$^{-3}$ or more, and
wherein the first to third conductive layers includes an N-type dopant.

17. The light emitting device according to claim 16,
wherein the second conductive type semiconductor layer includes a P-type dopant,
wherein the second conductive type semiconductor layer has a second current spread structure comprising a pair of a fourth conductive layer and a fifth conductive layer under the fourth conductive layer, a conductivity of the fourth conductive layer is higher than a conductivity of the fifth conductive layer, and the second current spreading structure is disposed in a sequence of the fifth conductive layer and the fourth conductive layer from the active layer,
wherein the pair of the fourth conductive layer and the fifth conductive layer are stacked in cycles of about 2 to about 50,
wherein the fifth conductive layer has a thickness greater than that of the fourth conductive layer,
wherein the second conductive type semiconductor layer comprises a sixth conductive layer physically contacted between the second current spread structure and the electrode layer,
wherein a conductivity of the sixth conductive layer is higher than the conductivity of the fifth conductive layer,
wherein the sixth conductive layer has a different hole concentration from a dopant concentration of the fourth conductive layer and a dopant concentration of the fifth conductive layer,
wherein the hole concentration of the sixth conductive layer is between the dopant concentration of the fourth conductive layer and the dopant concentration of the fifth conductive layer, and
wherein the hole concentration of the sixth conductive layer is about $1\sim9\times10^{17}$ cm$^{-3}$ or more.

18. The light emitting device according to claim 17, wherein the fourth conductive layer has a hole concentration of about $3\sim8\times10^{17}$ cm$^{-3}$ or more, and the fifth conductive layer has a hole concentration of about $1\sim5\times10^{15}$ cm$^{-3}$ or less.

19. The light emitting device according to claim 18, wherein the fourth and fifth conductive layers are formed of a same material from each other, and
wherein the fourth and sixth conductive layers includes a P-type dopant.

* * * * *